United States Patent [19]

Kojima

[11] Patent Number: 4,751,704
[45] Date of Patent: Jun. 14, 1988

[54] METHOD AND APPARATUS FOR DECODING BCH CODE

[75] Inventor: Yuichi Kojima, Tokyo, Japan

[73] Assignee: Sony Corporation, Tokyo, Japan

[21] Appl. No.: 870,513

[22] Filed: Jun. 4, 1986

[30] Foreign Application Priority Data

Jun. 7, 1985 [JP] Japan .................................. 60-123756

[51] Int. Cl.$^4$ ............................................. G06F 11/10
[52] U.S. Cl. ........................................ 371/37; 371/40
[58] Field of Search ...................... 371/37, 38, 39, 40

[56] References Cited

U.S. PATENT DOCUMENTS

| 3,278,729 | 10/1966 | Chien | 371/40 |
| 3,418,629 | 12/1968 | Chien | 371/37 |
| 3,781,791 | 12/1973 | Sullivan | 371/37 |
| 4,162,480 | 7/1979 | Berlekamp | 371/37 |
| 4,360,916 | 11/1982 | Kustedjo et al. | 371/37 |
| 4,494,234 | 1/1985 | Patel | 371/38 |
| 4,584,686 | 4/1986 | Fritze | 371/37 |
| 4,642,808 | 2/1987 | Baggen | 371/39 |
| 4,649,541 | 3/1987 | Lahmeyer | 371/37 |

Primary Examiner—Charles E. Atkinson
Attorney, Agent, or Firm—Hill, Van Santen, Steadman & Simpson

[57] ABSTRACT

Apparatus for decoding BCH code can correct double errors using a modification of the Chien search method. This decoding apparatus comprises circuits to form syndromes S1 and S3; a circuit to form $S1^2$; a circuit to form $S1^3$; a circuit to form ($S1^3 + S3$); and Chien search circuit, in which the error-location polynomial $\sigma(x) = (S1x^2 + S1^2x + S1^3 + S3)$ is solved, thereby correcting errors of two or less. With this apparatus, there is no need to perform a dividing process, and a high decoding processing speed can be realized without using any PLA or ROM.

4 Claims, 3 Drawing Sheets

METHOD AND APPARATUS FOR DECODING BCH CODE

BACKGROUND OF THE INVENTION

Field of the Invention and Related Art Statement

The present invention relates to an apparatus for decoding BCH (Bose-Chaudhuri-Hocquenghem) code capable of correcting double errors, by use of a Chien search method.

As one of the methods of decoding the BCH code which can correct double errors, there has been known a decoding method whereby two syndromes S1 and S3 are formed from the receiving sequence and then the error-location polynomial $$\sigma(x) = x^2 + S1\,x + S1^2 + (S3/S1)$$

is solved by the method called the Chien search method, thereby correcting the errors in the receiving sequence.

In this decoding process, the calculation of the syndromes S1 and S3 and the calculation of $S1^2$ can be relatively easily realized due to a hard-wired logic arrangement such as a gate array or the like. However, the dividing process of S3/S1 needs complicated calculations. Therefore, the method is performed using a dividing process performed using a ROM which limits the speed of operation which can be obtained.

When the decoding apparatus is in the form of an LSI, with the dividing circuit constituted by a PLA, the scale of the LSI chip is enlarged, which is a drawback. On the other hand, when dividing circuit is constituted by a ROM, the decoding processing time is restricted due to the access time, resulting in the drawback that the decoding process cannot be executed at a high speed.

SUMMARY OF THE INVENTION

It is therefore an object of the present invention to provide an apparatus for decoding BCH code which is suitable for LSI realization, without using any ROM or PLA.

According to the invention, there is provided a decoding apparatus of BCH code capable of correcting double errors by use of the Chien search method comprising:
circuits to form syndromes S1 and S3;
a circuit to form $S1^2$;
a circuit to form $S1^3$;
a circuit to form ($S1^3$ and S3); and
a Chien search circuit,
wherein the error-location polynomial $\sigma'(x)$ (= S1 $x^2 + S1^2\,x + S1^3 + S3$) is solved, thereby correcting errors of two or less.

By using the polynomial ($\sigma'(x)$ = S1 $x^2 + S1^2 x + S1^3 + S3$) as the error-location polynomial, the term for the dividing process of (S3/S1) is removed from the error-location polynomial, and the error-location polynomial is solved, thereby obtaining the error locations and correcting the errors, without dividing. Therefore, there is no need to perform the dividing process of (S3/S1), and the decoding apparatus having a simple constitution and a high decoding processing speed can be realized without using any PLA or ROM.

The above and other objects, features and advantages of the present invention will be more clear from the following description with reference to the accompanying drawings.

DETAILED DESCRIPTION OF PREFERRED EMBODIMENTS

Figure 1:
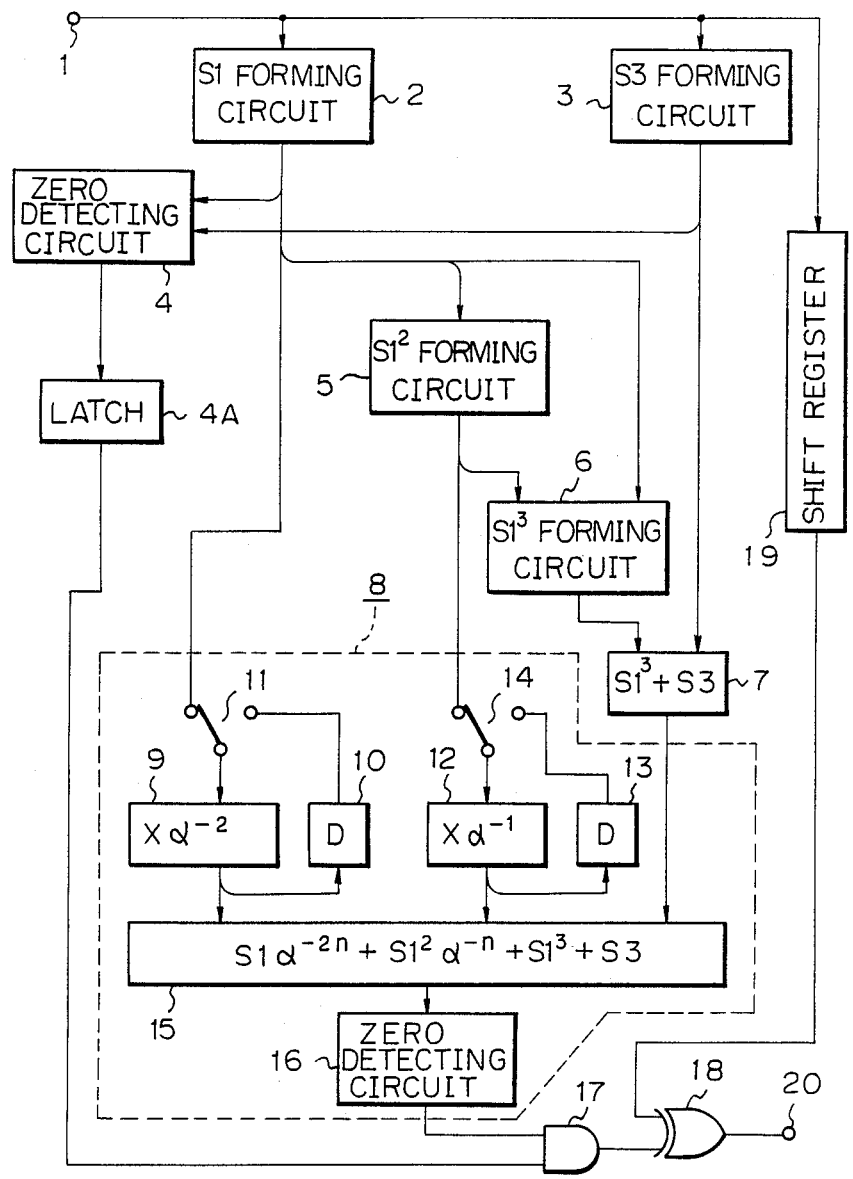
FIG. 1 is a functional block diagram of an illustrative embodiment of the present invention.

In FIG. 1, a receiving sequence is applied to an input terminal 1. The receiving sequence is supplied to an S1 forming circuit 2 and an S3 forming circuit 3 and the syndromes S1 and S3 are formed. The syndromes S1 and S3 are supplied to a zero detecting circuit 4. The zero detecting circuit 4 generates a detection signal of a low level "L" when all of the digits of the syndromes S1 and S3 are "0", namely, when no error is detected. This detection signal is supplied into a latch circuit 4A synchronously with the receiving sequence.

The syndrome S1 is supplied to an $S1^2$ forming circuit 5 and an $S1^3$ forming circuit 6 and the values of $S1^2$ and $S1^3$ are produced. The $S1^3$ forming circuit 6 multiplies $S1^2$ with S1 to produce $S1^3$ as will be explained hereinafter. The syndromes S3 and $S1^3$ are supplied to an arithmetic operating circuit 7, by which ($S1^3 + S3$) is formed.

In this manner, the respective coefficients S1, $S1^2$, $S1^3$, and S3 of the error-location polynomial $\sigma'(x)$ are obtained and supplied to a Chien search circuit 8 for performing the process of the Chien search. The Chien search circuit 8 is shown as the region surrounded by the broken line in FIG. 1 and comprises: arithmetic operating circuits 9 and 12; delay circuits 10 and 13, each having the delay time of one clock pulse; switching circuits 11 and 14; an adding circuit 15; and a zero detecting circuit 16. The switching circuits 11 and 14 respectively select the syndrome S1 from the S1 forming circuit 2 and $S1^2$ from the $S1^2$ forming circuit 5 at the time of the head bit of the receiving sequence. The switching circuits 11 and 14 respectively select outputs of the delay circuits 10 and 13 with respect to the remaining bits. Control of the switching circuits 11 and 14 is accomplished by a conventional circuit for generating timing control signals, operating in synchronism with the receiving sequence.

Outputs of the switching circuits 11 and 14 are supplied to the arithmetic operating circuits 9 and 12, respectively. Outputs of the operating circuits 9 and 12 are supplied to the delay circuits 10 and 13, respectively. In this way, the cyclic consitituion is obtained. The operating circuit 9 multiplies $\alpha^{-2}$ and the operating circuit 12 multiplies $\alpha^{-1}$. $\alpha$ is the root of the generator polynomial over GF ($2^m$). Assuming that a code length is n, the term of S1 $\alpha^{-2n}$ is obtained by the operating circuit 9 and the term of $S1^2 \alpha^{-n}$ is derived by the operating circuit 12. The outputs of the operating circuits 9 and 12 are supplied to the adding circuit 15 to perform the addition of (mod 2).

The adding circuit 15 executes the arithmetic operation of the error-location polynomial ($\sigma'(x)$=S1 $x^2$+S1$^2$x+S1$^3$+S3). An output of the adding circuit 15 is supplied to the zero detecting circuit 16. The position where the output of the adding circuit 15 becomes zero is the error location. The zero detecting circuit 16 generates a correction instructing signal which becomes a high level "H" at the error location.

The correction instructing signal from the zero detecting circuit 16 is supplied to an AND gate 17 together with an output of the latch circuit 4A. The output of the latch circuit 4A becomes a low level "L", due to the zero detecting circuit 4, when all digits of both of the syndromes S1 and S3 are "O". When (S1=S3=O), the result of the operation of the error-location polynomial becomes zero, so that the correction instructing signal which signals an error is generated from the zero detecting circuit 16. The AND gate 17 is provided to inhibit an improper correction instruction signal.

The correction instructing signal of "H" from the AND gate 17 is supplied to an exclusive OR gate (hereinafter referred to as EX-OR gate) 18. The bits of the receiving sequence from a shift register 19 are inverted by the EX-OR gate 18 in response to the correction instructing signal which is generated in correspondence to the error location, so that the bit errors are corrected. The error-corrected data sequence from the EX-OR gate 18 is taken out to an output terminal 20. The shift register 19 delays the receiving sequence by the period of time necessary for detection of the error location.

The invention can be applied to decode, for example, the (15, 7) BCH code, which (15) denotes the code length and (7) is the information bit length and the minimum distance is 5. Therefore, the errors of two bits or less can be corrected. The generator polynomial of this code is $$G(x) = (x^4 + x + 1)(x^4 + x^3 + x^2 + x + 1)$$
$$= (x^8 + x^7 + x^6 + x^4 + 1$$

Assuming that $\alpha$ is the root of $(x^4+x+1)=0$, the minimal polynomial having $\alpha^3$ as the root is $(x^4+x^3+x^2+x+1)$. The elements over the Galois Field GF($2^4$) which is given by $(x^4+x+1)=0$ are as follows.

| | $\alpha^3$ | $\alpha^2$ | $\alpha^1$ | $\alpha^0$ |
|---|---|---|---|---|
| 0 | 0 | 0 | 0 | 0 |
| $\alpha^0$ | 0 | 0 | 0 | 1 |
| $\alpha^1$ | 0 | 0 | 1 | 0 |
| $\alpha^2$ | 0 | 1 | 0 | 0 |
| $\alpha^3$ | 1 | 0 | 0 | 0 |
| $\alpha^4$ | 0 | 0 | 1 | 1 |
| $\alpha^5$ | 0 | 1 | 1 | 0 |
| $\alpha^6$ | 1 | 1 | 0 | 0 |
| $\alpha^7$ | 1 | 0 | 1 | 1 |
| $\alpha^8$ | 0 | 1 | 0 | 1 |
| $\alpha^9$ | 1 | 0 | 1 | 0 |
| $\alpha^{10}$ | 0 | 1 | 1 | 1 |
| $\alpha^{11}$ | 1 | 1 | 1 | 0 |
| $\alpha^{12}$ | 1 | 1 | 1 | 1 |
| $\alpha^{13}$ | 1 | 1 | 0 | 1 |
| $\alpha^{14}$ | 1 | 0 | 0 | 1 |

The parity-check matrix H of this code is shown below.

$$H = \begin{pmatrix} \alpha^0 & \alpha^1 & \alpha^2 & \alpha^3 & \alpha^4 & \alpha^5 & \alpha^6 & \alpha^7 & \alpha^8 & \alpha^9 & \alpha^{10} & \alpha^{11} & \alpha^{12} & \alpha^{13} & \alpha^{14} \\ \alpha^0 & \alpha^3 & \alpha^9 & \alpha^{12} & \alpha^0 & \alpha^3 & \alpha^6 & \alpha^9 & \alpha^{12} & \alpha^0 & \alpha^3 & \alpha^6 & \alpha^9 & \alpha^{12} \end{pmatrix}$$

$$= \begin{pmatrix} 1 & 0 & 0 & 0 & 1 & 0 & 0 & 1 & 1 & 0 & 1 & 0 & 1 & 1 & 1 \\ 0 & 1 & 0 & 0 & 1 & 1 & 0 & 1 & 0 & 1 & 1 & 1 & 1 & 0 & 0 \\ 0 & 0 & 1 & 0 & 0 & 1 & 1 & 0 & 1 & 0 & 1 & 1 & 1 & 1 & 0 \\ 0 & 0 & 0 & 1 & 0 & 0 & 1 & 1 & 0 & 1 & 0 & 1 & 1 & 1 & 1 \\ 1 & 0 & 0 & 0 & 1 & 1 & 0 & 0 & 0 & 1 & 1 & 0 & 0 & 0 & 1 \\ 0 & 0 & 0 & 1 & 1 & 0 & 0 & 0 & 1 & 1 & 0 & 0 & 0 & 1 & 1 \\ 0 & 0 & 1 & 0 & 1 & 0 & 0 & 1 & 0 & 1 & 0 & 0 & 1 & 0 & 1 \\ 0 & 1 & 1 & 1 & 1 & 0 & 1 & 1 & 1 & 1 & 0 & 1 & 1 & 1 & 1 \end{pmatrix}$$

Figure 2:
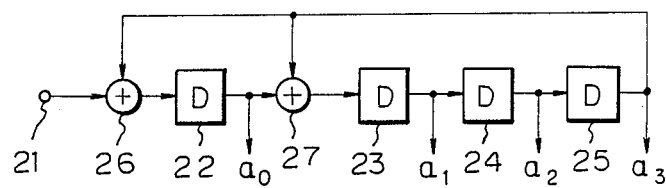
FIG. 2 is a block diagram of a circuit to form the syndrome S1.

FIG. 2 shows an example of the S1 forming circuit 2 to form the syndrome S1. The syndrome can be obtained by calculating $\gamma(\alpha^j)$ with respect to the receiving code word $$\gamma(x) = \gamma 0 + \gamma 1 x + \ldots + \gamma 14 x^{14}$$

The S1 forming circuit 2 calculates (j=1), namely, $\gamma(\alpha)$. As shown in FIG. 2, with respect to the receiving sequence from an input terminal 21, flip-flops 22, 23, 24 and 25 each having the delay time of one clock are cascade-connected. In the case of the polynominal $(x^4+x+1)$, an adding circuit 26 is inserted between the input terminal 21 and the flip-flop 22. The adding circuit 26 performs the addition of (mod 2) and may be realized by an EX-OR gate. All of the following adding circuits are similarly the adding circuits of (mod 2).

The additions of (mod 2) are as follows:

$0 \oplus 0 = 0$ $0 \oplus 1 = 1$ $1 \oplus 0 = 1$ $1 \oplus 1 = 0$

An adding circuit 27 is also provided between the flip-flops 22 and 23. An output of the flip-flop 25 is fed back to the adding circuits 26 and 27, respectively.

When a "1" signal is provided to the input terminal 21 and the shift registers consisting of the flip-flops 22 to 25 are sequentially shifted, the binary expressions of $\alpha^0$, $\alpha^1$, ---, $\alpha^{14}$ are provided outputs from the flip-flops, respectively. Therefore, by sequentially providing, as inputs, the receiving sequence $\gamma14$, $\gamma13$, ---, $\gamma0$ to the input terminal 21, the syndrome S1 (a0, a1, a2, a3) is obtained.

Figure 3:
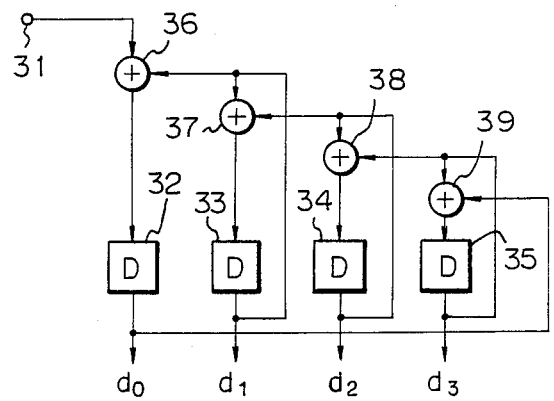
FIG. 3 is a block diagram of a circuit to form the syndrome S3.

FIG. 3 shows an example of the S3 forming circuit 3 to form the syndrome S3. The S3 forming circuit 3 calculates (j=3), namely, $\gamma(\alpha^3)$. Four flip-flops 32, 33, 34, and 35 are provided. Adding circuits 36, 37, 38, and 39 are also provided on the input sides of the flip flops 32 to 25, respectively. The receiving sequence from an input terminal 31 and an output of the flip-flop 33 are supplied to the adding circuit 36. Outputs of the flip-flops 33 and 34 are supplied to the adding circuit 37. Outputs of the flip-flops 34 and 35 are supplied to the adding circuit 38. Outputs of the flip-flops 35 and 32 are supplied to the adding circuit 39.

By sequentially providing the receiving sequence $\gamma14$, $\gamma13$, ---, $\gamma0$ to the input terminal 31, the syndrome S3 (d0, d1, d2, d3) is obtained.

Figure 4:
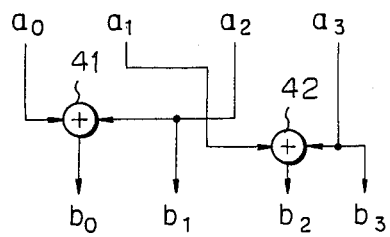
FIG. 4 is a block diagram of a circuit to form $S1^2$.

FIG. 4 shows an example of the S1$^2$ forming circuit 5 to form the square of the syndrome S1 (a0, a1, a2, a3). The S1$^2$ forming circuit 5 comprises an adding circuit 41 which is supplied with a0 and a2 and an adding circuit 42 which is supplied with a1 and a3. Assuming that $S1^2$ is (b0, b1, b2, b3) then b0 is the output from the adding circuit 41, and a2 is connected to the output as b1; b2 is connected to the output from the adding circuit 42 and a3 is connected to the output as b3.

Figure 5:
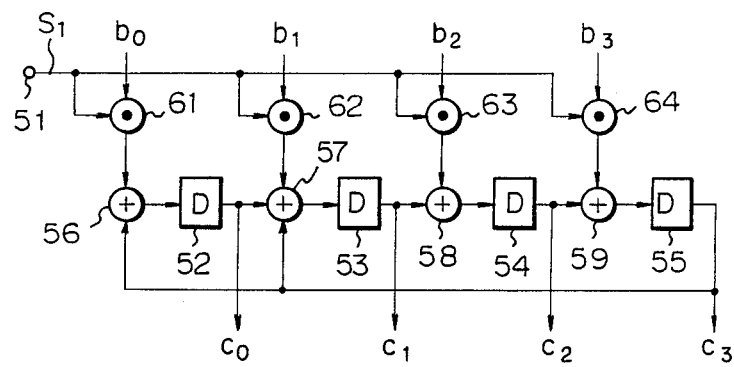
FIG. 5 is a block diagram of a circuit to form $S1^3$.

FIG. 5 shows an arrangement of an example of the $S1^3$ forming circuit 6. The syndrome S1 (a0, a1, a2, a3) produced by the S1 forming circuit 2 is provided to an input terminal 51. Adding circuits 56, 57, 58, and 59 are provided on the input sides of four flip-flops 52, 53, 54, and 55 which are cascade-connected, respectively. An output of the flip-flop 55 is fed back as one input of each of the adding circuits 56 to 59. Outputs of multiplying circuits 61, 62, 63, and 64, to execute the multiplications of (mod 2), are supplied as the other inputs of the adding circuits 56 and 57, respectively.

The multiplications of (mod 2) are as follows:

$$0 \cdot 0 = 0$$

$$0 \cdot 1 = 0$$

$$1 \cdot 0 = 0$$

$$1 \cdot 1 = 1$$

The syndrome S1 from the input terminal 51 is supplied to one input of each of the multiplying circuits 61 to 64, and $s1^2$ (b0, b1, b2, b3) is supplied to the other inputs of the multiplying circuits 61 to 64, respectively. $S1^3$ (c0, c1, c2, c3) is generated as outputs of the flip-flops 52 to 55, respectively. Namely, the $S1^3$ forming circuit of 6 FIG. 5 multiplies $S1^2$ with S1.

An explanation is made hereinbelow as to the product C of two elements A and B over the Galois Field, which can be derived by the $S1^3$ forming circuit 6 of FIG. 5.

First, it is assumed that the elements A and B are expressed by the following polynomial expressions.

$$A = a3\,\alpha^3 + a2\,\alpha^2 + a1\alpha + a0$$

$$B = b3\,\alpha^3 + b2\,\alpha^2 + b1\alpha + b0$$

The product C of the elements A and B is as shown below.

$$\begin{aligned}
C &= A \times B \\
&= (a3\,\alpha^3 + a2\,\alpha^2 + a1\alpha + a0) \times \\
&\quad (b3\,\alpha^3 + b2\,\alpha^2 + b1\alpha + b0) \\
&= (a3\,b3\,\alpha^3 + a2\,b3\,\alpha^2 + a1\,b3\alpha + a0\,b3)\,\alpha^3 + \\
&\quad (a3\,b2\,\alpha^3 + a2\,b2\,\alpha^2 + a1\,b2\alpha + a0\,b2)\,\alpha^2 + \\
&\quad (a3\,b1\,\alpha^3 + a2\,b1\,\alpha^2 + a1\,b1\alpha + a0\,b1)\,\alpha + \\
&\quad (a3\,b0\,\alpha^3 + a2\,b0\,\alpha^2 + a1\,b0\alpha + a0\,b0) \\
&= c3\,\alpha^3 + c2\,\alpha^2 + c1\alpha + c0
\end{aligned}$$

The flip flops 52 to 55 are sequentially shifted for every clock from the initial state. The output C''' becomes $$C''' = c3$$

by the first shift. The output C'' becomes $$C'' = c3\alpha + c2$$

by the second shift. The output C' becomes $$\begin{aligned}
C' &= (c3\alpha + c2)\alpha + c1 \\
&= c3\,\alpha^2 + c2\alpha + c1
\end{aligned}$$

by the third shift. The output C becomes $$\begin{aligned}
C &= (c3\,\alpha^2 + c2\alpha + c1)\alpha + c0 \\
&= c3\,\alpha^3 + c2\,\alpha^2 + c1\,\alpha + c0
\end{aligned}$$

by the fourth shift. In this manner, the multiplications are completed.

The case where ($A = \alpha^3$) and ($B = \alpha^6$) will be described as practical example. These values are represented by the following binary expressions.

$$(a3, a2, a1, a0) = (1\;0\;0\;0)$$

$$(b3, b2, b1, b0) = (1\;1\;0\;0)$$

When the shifting operations are sequentially performed from the initial state, the outputs (c3, c2, c1, c0) change as shown in the following table.

|  | Input | c3 | c2 | c1 | c0 |
|---|---|---|---|---|---|
| Initial state | 1 | 0 | 0 | 0 | 0 |
| First shift | 1 | 1 | 0 | 0 | 0 |
| Second shift | 0 | 1 | 0 | 1 | 1 |
| Third shift | 0 | 0 | 1 | 0 | 1 |
| Fourth shift | — | 1 | 0 | 1 | 0 |

As will be obviously understood from this table, the multiplication output of ($\alpha^3 \times \alpha^6 = \alpha^9 = 1\;0\;1\;0$) can be obtained by performing the shifting operations four times.

Different from the case where $S1^3$ is directly obtained from the syndrome S1, the $S1^3$ forming circuit 6 in this embodiment derives $S1^3$ by multiplying both S1 and $S1^2$. Consequently, the circuit constitution can be remarkably simplified.

Figure 6:
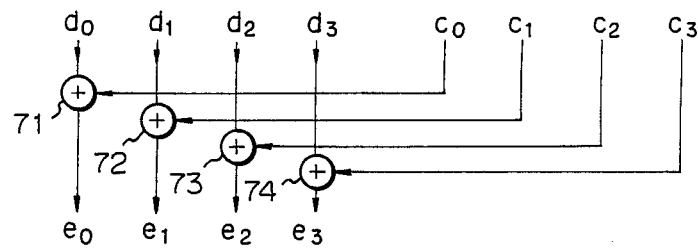
FIG. 6 is a block diagram of a circuit to form ($S1^3 + S3$)

As shown in FIG. 6, in the arithmetic operating circuit 7 which obtains ($S1^3 + S3$), the corresponding bits of S3 (=c0, c1, c2, c3) and $S1^3$ (=d0, d1, d2, d3) are respectively supplied to adding circuits 71, 72, 73, and 74. The binary expressions (e0, e1, e2, e3) of ($S1^3 + S3$) are derived from the adding circuits 71 to 74.

Figure 7:
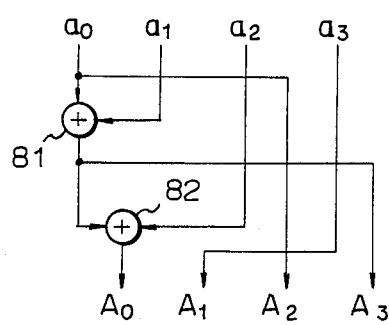
FIG. 7 is a block diagram of a circuit to multiply $\alpha^{-2}$.

The arithmetic operating circuit 9 to multiply the syndrome S1 (a3, a2, a1, a0) with $\alpha^{-2}$ comprises adding circuits 81 and 82 as shown in FIG. 7; a0 and a1 are supplied to the adding circuit 81. An output of the adding circuit 81 and a2 are supplied to the adding circuit 82. The output of the adding circuit 82 is A0, the input a3 is A1, the input a0 is A2, and the output of the adding circuit 81 is A3. Namely, $$\begin{aligned}
&\alpha^{-2}\,(a0 + a1\alpha + a2\,\alpha^2 + a3\,\alpha^3) \\
&= a0\,\alpha^{-2} + a1\,\alpha^{-1} + a2 + a3\alpha \\
&= a0(\alpha^3 + \alpha^2 + 1) + a1(\alpha^3 + 1) + a2 + a3\alpha \\
&= (a0 + a1 + a2) + a3\alpha + a0\,\alpha^2 + (a0 + a1)\,\alpha^3 \\
&= A0 + A1\alpha + A2\,\alpha^2 + A3\,\alpha^3
\end{aligned}$$

Figure 8:
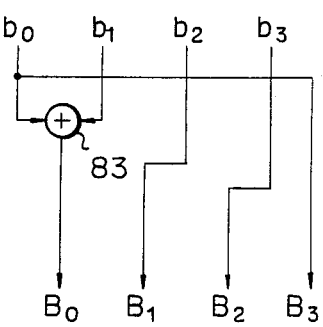
FIG. 8 is a block diagram of a circuit to multiply $\alpha^{-1}$.

The arithmetic operating circuit 12 to multiply $S1^2$ (b3, b2, b1, b0) with $\alpha^{-1}$ comprises an adding circuit 83 as shown in FIG. 8. b0 and b1 are supplied to the adding circuit 83. An output of the adding circuit 83 is B0, the input b2 is B1, the input b3 is B2, and the input b0 is B3. Namely, $$\alpha^{-1}(b0 + b1\alpha + b2\alpha^2 + b3\alpha^3)$$
$$= b0(\alpha^3 + 1) + b1 + b2\alpha + b3\alpha^2$$
$$= (b0 + b1) + b2\alpha + b3\alpha^2 + b0\alpha^3$$
$$= B0 + B1\alpha + B2\alpha^2 + B3\alpha^3$$

According to the present invention, since there is no need to calculate the term of division of (S3/S1) in the error-location polynomial $\sigma(x)$, it is unnecessary to use any dividing circuit embodied in complicated hard-logic, or any dividing circuit using a ROM, which restricts the decoding processing speed of the whole decoding apparatus. Consequently, it is possible to realize the decoding apparatus having a simple constitution and a hard-wired logic arrangement such as a gate array or the like, which is suitable for production in the form of an LSI.

Although the present invention has been shown and described with respect to preferred embodiments, various changes and modifications which are obvious to a person skilled in the art to which the invention pertains are deemed to lie within the spirit and scope of the invention.

What is claimed is:

1. An apparatus for decoding BCH code comprising:
   first and second circuits to form syndromes S1 and S3, respectively, from a receiving sequence;
   a third circuit connected with said first circuit to form $S1^2$ from the syndrome S1;
   a fourth circuit connected with said first and third circuits to form $S1^3$ from the syndrome S1;
   a fifth circuit connected to form $(S1^3+S3)$; and
   a Chien search circuit connected with said first, third and fifth circuits to receive said S1, $S1^2$, and $(S1^3+S3)$, and to solve the error-location polynomial $$(\sigma(x)=S1\ x^2+S1^2x+S1^3+S3)$$

thereby correcting errors of two or less in said receiving sequence.

2. An apparatus for decoding BCH code according to claim 1, wherein said fourth circuit to form $S1^3$ multiplies $S1^2$ with S1.

3. An apparatus for decoding BCH code according to claim 1, including a zero detecting circuit which is supplied with said syndromes S1 and S3, and a gating circuit connected to said zero detecting circuit to inhibit an output of said Chien search circuit when both of said syndromes S1 and S3 are 0.

4. A method for decoding BCH code, including the steps of first forming the syndrome S1 and S3 from a receiving sequence, then forming $S1^2$ and $S1^3$ from S1 and $S1^2$ respectively, combining said syndromes to form $(S1^3+S3)$, and using a Chien search circuit to produce an output signal corresponding to $\sigma(x)=S1\ x^2+S1^2x+S1^3+S3$, and inverting bits in said receiving sequence in accordance with said output signal, thereby correcting errors in said receiving sequence.

* * * * *